(12) United States Patent
Izumi et al.

(10) Patent No.: US 7,075,614 B2
(45) Date of Patent: Jul. 11, 2006

(54) METHOD OF MAKING ACTIVE MATRIX SUBSTRATE WITH PIXEL ELECTRODES OF PHOTOSENSITIVE CONDUCTIVE MATERIAL

(75) Inventors: Yoshihiro Izumi, Kashihara (JP); Yoshimasa Chikama, Souraku-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/748,140

(22) Filed: Dec. 31, 2003

(65) Prior Publication Data
US 2004/0150778 A1 Aug. 5, 2004

Related U.S. Application Data

(62) Division of application No. 09/863,266, filed on May 24, 2001, now abandoned.

(30) Foreign Application Priority Data

| Jun. 2, 2000 | (JP) | ............................. 2000-165848 |
| Feb. 9, 2001 | (JP) | ................................ 2001-33760 |

(51) Int. Cl.
*G02F 1/1343* (2006.01)
(52) U.S. Cl. .................... 349/187; 349/143; 250/208.1
(58) Field of Classification Search ................ 349/143, 349/187
See application file for complete search history.

(56) References Cited

U.S. PATENT DOCUMENTS

| 4,902,592 A | 2/1990 | Matsumura et al. |
| 4,938,569 A | 7/1990 | Tsunoda et al. |
| 5,198,377 A | 3/1993 | Kato et al. |
| 5,757,444 A * | 5/1998 | Takemura .................... 349/38 |
| 5,852,485 A | 12/1998 | Shimada et al. |
| 5,858,581 A | 1/1999 | Stephenson |
| 5,946,065 A * | 8/1999 | Tagusa et al. .............. 349/138 |
| 5,953,084 A | 9/1999 | Shimada et al. |
| 5,976,734 A | 11/1999 | Yamaguchi |
| 5,990,994 A | 11/1999 | Stephenson |
| 6,036,329 A | 3/2000 | Limura |
| 6,052,162 A | 4/2000 | Shimada et al. |
| 6,088,071 A | 7/2000 | Yamamoto et al. |
| 6,097,452 A | 8/2000 | Shimada et al. |
| 6,219,119 B1 | 4/2001 | Nakai |
| 6,242,746 B1 | 6/2001 | Teranuma et al. |

(Continued)

FOREIGN PATENT DOCUMENTS

JP 04081820 A 3/1992

(Continued)

OTHER PUBLICATIONS

Japanese Office Action dated Jan. 6, 2004 (no English translation thereof).

(Continued)

*Primary Examiner*—Andrew Schechter
(74) *Attorney, Agent, or Firm*—Nixon & Vanderhye P.C.

(57) ABSTRACT

There is provided an active matrix substrate which enables to shorten a fabrication process of a pixel electrode, improve exposure precision by self alignment, and prevent leakage failures between pixel electrodes. On top of the interlayer insulating film, there are formed pixel electrodes, which are connected to the TFTs through contact holes piercing through the interlayer insulating film. The pixel electrodes are formed by applying on the interlayer insulating film a photosensitive transparent resin such as negative acrylic polymerized resin containing ITO, ATO or ZnO as transparent conductive particles, performing exposure from the back side of the substrate, and conducting development.

5 Claims, 9 Drawing Sheets

U.S. PATENT DOCUMENTS 6,414,729 B1    7/2002    Akiyama et al.
6,556,271 B1 *    4/2003    Tsujimura et al. .......... 349/187

FOREIGN PATENT DOCUMENTS

| | | |
|---|---|---|
| JP | 9-152625 | 6/1997 |
| JP | 10-20321 | 1/1998 |
| JP | 10-255556 | 9/1998 |
| JP | 11-287862 | 10/1999 |
| JP | 2000-98367 | 4/2000 |
| KR | 1998-071773 | 10/1998 |

OTHER PUBLICATIONS

U.S. Appl. No. 09/863,266, filed May 24, 2001.

Denny L. Lee et al.: "A New Digital Detector for Projection Radiography", Proc. SPIE, vol. 2432, pp. 237-249, 1995.

Korean Office Action dated Jun. 26, 2003 (no translation).

Chinese Office Action dated Aug. 8, 2003 (with English translation).

* cited by examiner

LIGHT

METHOD OF MAKING ACTIVE MATRIX SUBSTRATE WITH PIXEL ELECTRODES OF PHOTOSENSITIVE CONDUCTIVE MATERIAL

This application is a divisional of U.S. Ser. No. 09/863,266, filed May 24, 2001 now abandoned, the disclosure of which is hereby incorporated herein by reference.

BACKGROUND OF THE INVENTION

The present invention relates to an active matrix substrate, and flat panel display device and image sensing device using the same.

A liquid crystal display device, as is generally known, holds liquid crystal molecules in between two substrates on which electrodes are formed, and electric signals applied to between the electrodes on the both substrates vary the transmissivity of light coming from back light, by which information is displayed. Compared to cathode-ray tube display devices, the liquid crystal display devices are thin, light-weighted, and low power consumption, and mounted on such devices as desktop personal information terminal equipment and amusement instruments.

As demands for high fineness and high image quality are increasing, a prevailing liquid crystal display device is the one of an active matrix type having active elements such as thin-film transistors (hereinafter referred to as TFT). In the field of the active matrix-type liquid crystal display device, much development efforts for increasing the aperture ratio of a pixel is made. This is because increase of the aperture ratio improves the transmissivity of incident light from back light, so that the same illuminance can be obtained with decreased power consumption and with the same power consumption, higher illuminance can be obtained.

As such an active matrix-type liquid crystal display device with increased aperture ratio, there has been proposed, for example in Japanese Patent No. 2933879 which belongs to an applicant of the present invention, a liquid crystal display device in which a pixel electrode is extended all over an aperture portion. One of the pixels formed on a substrate in the shape of a matrix is shown in FIGS. 7 and 8. FIG. 7 is a plan view of an active matrix substrate, and FIG. 8 is a cross sectional view of FIG. 7 taken on line 8—8.

The active matrix substrate of the liquid crystal display device is mainly configured as follows. On a light permeable substrate 21, there are provided a TFT 14 serving as a switching element, a gate signal line 12 for controlling the TFT 14, a source signal line 13 connected to the TFT 14 and formed orthogonal to the gate signal line 12, an interlayer insulating film 28 formed on the TFT 14, the gate signal line 12 and the source signal line 13, and a pixel electrode 11 to be connected to the TFT 14 through a contact hole 16 passing through the interlayer insulating film 28.

The active matrix substrate of the liquid crystal display device is fabricated by the following process. First, a gate signal line 12 and a capacity line 17 are formed on a light permeable substrate 21, and a gate insulating film 23 is formed so as at least to cover those lines 12 and 17. After that, at the place for forming a TFT 14, there are created a semiconductor layer 24, a channel protection layer 25 as needed, a source electrode 26a, and a drain electrode 26b. Then, there are formed a source signal line 13 to be connected to the source electrode 26a, and a connection electrode 15 to be connected to the drain electrode 26b, and thereafter an interlayer insulating film 28 is formed over the entire surface of the substrate. Further, in order to establish contact between a pixel electrode 11 formed on the interlayer insulating film 28 and the connection electrode 15, a contact hole 16 is provided in the interlayer insulating film 28. Thus, the liquid crystal display device is formed. It is noted that part of the connection electrode 15 and the source signal line 13 are, as shown in FIG. 8, formed by laminating a transparent conductive line 27a and a metal line 27b.

The pixel electrode 11 is formed by the following steps. First, the interlayer insulating film 28 and the contact hole 16 are formed, after which a transparent conductive film such as ITO (indium tin oxide) films is formed by a sputter technique and the like. On the transparent conductive film, positive type resist is applied by spin coating method. Next, while alignment with the gate signal line 12 and the source signal line 13 is performed, an exposure mask is set by an exposure device such as steppers, and exposure is made from the upper side. Then, the transparent conductive film is etched in accordance with an exposed pattern to complete the pixel electrode 11.

On the other hand, there is a method disclosed by the applicant of the present invention in Patent Laid-Open Publication HEI 10-20321, in which ITO by the spatter technique is not used in creation of pixel electrodes, but ITO materials enabling the formation of film by coating method are used to thicken the pixel electrode 11 at the position of the contact hole 16 so that rubbing errors and display errors are prevented by planarization. However, although there is a difference that an ITO film to be served as the pixel electrode 11 is formed by the coating method, this method is the same as the above stated fabrication method in the point that a patterning process of the ITO film uses a photo lithography technique and an etching technique.

It will be understood that the above-stated active matrix substrate having pixel electrodes formed on an interlayer insulating film is used not only in flat panel display devices such as liquid crystal display devices but also in flat panel image sensing devices as disclosed for example in "A New Digital Detector for Projection Radiography", Proc. SPIE, Vol. 2432, pp. 237–249, 1995 by Denny L. Lee, et al.

However, the conventional active matrix substrate described hereinabove has following problems.

i) Creation of the pixel electrode 11 requires a series of steps after an ITO film is fabricated by the above-stated method over the entire surface of a substrate, the steps including application of photo resist, mask exposure and development of the photo resist, etching of the ITO film, and removal of the photo resist, resulting in long fabrication process of the pixel electrode 11.

ii) In the process of patterning an ITO film, when photo resist applied on the ITO film is mask-exposed, dispersion of exposure precision (pattern accuracy of photo resist) within the substrate causes corresponding dispersion of parasitic capacitance generated in a superposed portion of the pixel electrode 11 and the gate signal line 12 or in a superposed portion of the pixel electrode 11 and the source signal line 13. The dispersion of the parasitic capacitance affects the uniformity of display in display devices. Upon exposure of photo resist especially by a stepper exposing device, the parasitic capacitance shows slight variance per shot of the stepper, resulting in facilitated generation of irregular display per shot.

iii) In the process of patterning an ITO film, when positive type photo resist applied on the ITO film is mask-exposed, foreign matters such as dust attached on the substrate or on the mask hinder the photo resist of the attached area from being exposed, as a consequence of which the attached area is left as an unnecessary resist pattern. If the unnecessary resist pattern is present in a clearance portion between adjacent pixel electrodes, the ITO film of the portion is not etched and remained in an etching step thereafter, which may establish electrical connection between the pixel electrodes, causing leakage failures.

SUMMARY OF THE INVENTION

Accordingly, it is an object of the present invention to provide an active matrix substrate which enables, by changing materials of a pixel electrode, to shorten the fabrication process of the pixel electrode, improve exposure precision by self alignment, and prevent leakage failures between the pixel electrodes, and to provide a display device and an image sensing device using the same.

In order to accomplish the above object, an active matrix substrate of the present invention comprises:

switching elements disposed in a shape of a matrix;

gate signal lines controlling the switching elements;

source signal lines connected to the switching elements and formed orthogonal to the gate signal lines;

an interlayer insulating film formed on the switching elements, the gate signal lines, and the source signal lines; and pixel electrodes formed on the interlayer insulating film and connected to the switching elements through contact holes piercing through the interlayer insulating film, wherein the pixel electrodes are made from a photosensitive conductive material.

In the above-configured active matrix substrate, the pixel electrodes are made from a photosensitive conductive material, so that in the process of patterning the pixel electrodes, the step of etching using photo resist is not required. That is to say, the pixel electrodes can be fabricated by a simple process consisting of applying a conductive material with photosensitivity on the substrate, and performing photo exposure and development. Therefore, the fabrication process of the pixel electrode can be shortened. In addition, vacuum film-forming devices such as sputters as well as etching units for ITO are not required, which enables reduction of equipment investments, decrease of device space required, and increase of working efficiency. Further in this active matrix substrate, the pixel electrodes are formed on the interlayer insulating film, which is formed on the switching elements, the gate signal lines, and the source signal lines, so that the pixel electrodes are to be formed in the final fabrication process of the active matrix substrate. Consequently, the material of the pixel electrode does not affect the film-formation process of other parts, which brings about broader selections of materials for the pixel electrode. For example, materials with both the organic and inorganic physical properties such as coat-type conductive materials containing an organic component (resin component) can be broadly used.

In one embodiment the photosensitive conductive material is transparent.

In this case, the pixel electrode is transparent, so that the active matrix substrate according to the embodiment can be used as an active matrix substrate for transmission type display devices.

In one embodiment, the photosensitive conductive material has negative type photosensitivity.

In this case, using the gate signal lines and the source signal lines formed on the substrate as exposure masks and performing exposure from the back side of the substrate enable self-aligned pattern formation of film placed for the pixel electrodes and the like on the front side without practicing alignment. As a result, dispersion of parasitic capacitance, which is generated in a superposed portion of the pixel electrode and the gate signal line or in a superposed portion of the pixel electrode and the source signal line, can be uniformed in the entire pixel area, by which the uniformity of display is improved. In addition, a photosensitive conductive material applied over each signal line is not exposed unless any defect such as open holes are present on the signal lines. Accordingly, unlike the case of mask exposure of conventional positive type photo resist, a conductive film remain is not generated in clearance between pixel electrodes by the presence of dust in the process of exposure. Therefore, short-circuit between the pixel electrodes is not produced, which ensures insulation between the pixel electrodes.

In one embodiment, the photosensitive conductive material is made from photosensitive resin and conductive particles dispersed in the photosensitive resin.

In this case, the photosensitive conductive material can be formed easily. It is also advantageous that the photosensitive resin determining patterning conditions such as pre-bake temperature and light exposure and the conductive particles determining conductivity can be separately optimized.

Use of indium tin oxide, antimony tin oxide, or zinc oxide as conductive particles provides transparency and electric characteristics required for the pixel electrode.

The photosensitive conductive material may contain color agents such as pigments. This gives the pixel electrode an additional function as a color filter for color display. Conventionally, for formation of an active matrix substrate applicable to the display device capable of color display, a color filter formation process is required in addition to a fabrication process of the pixel electrode. However, in the case of the active matrix substrate of the present invention, the color filter formation process can be omitted.

There has been adopted a method in which a color filter for color display is formed on the side of an opposite substrate opposite to an active matrix substrate, and then the opposite substrate and the active matrix substrate are stuck together. In this method, however, if displacement is generated in the course of sticking the both substrates together, especially in the case where the active matrix substrate and the opposite substrate are made from a material (e.g. plastic) that shrink with heat or moisture, the sticking precision of the substrates is degraded and substantial aperture ratio of the pixel is decreased. The decrease of the aperture ratio is incremental as the size of the pixel is getting smaller, that is, the finesse of the active matrix substrate becomes higher, or the active matrix substrate has larger area.

Contrary to this, formation of a pixel electrode with a photosensitive conductive material containing color agents such as pigments allows the pixel electrode to function as a color filter as well. This eliminates necessity of forming a color filter on the opposite substrate side like the prior art. Consequently, any displacement, if it is generated between the substrates in the course of sticking the substrates together, will not decrease the aperture ratio of the pixel.

Also in the present invention, there is provided a flat panel display device and an image sensing device using the active matrix substrate having any one of the above stated configurations. This display device and image sensing device also implement the above-mentioned functions and effects.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The embodiments of the present invention will be described hereinafter with reference to drawings.

Figure 1:
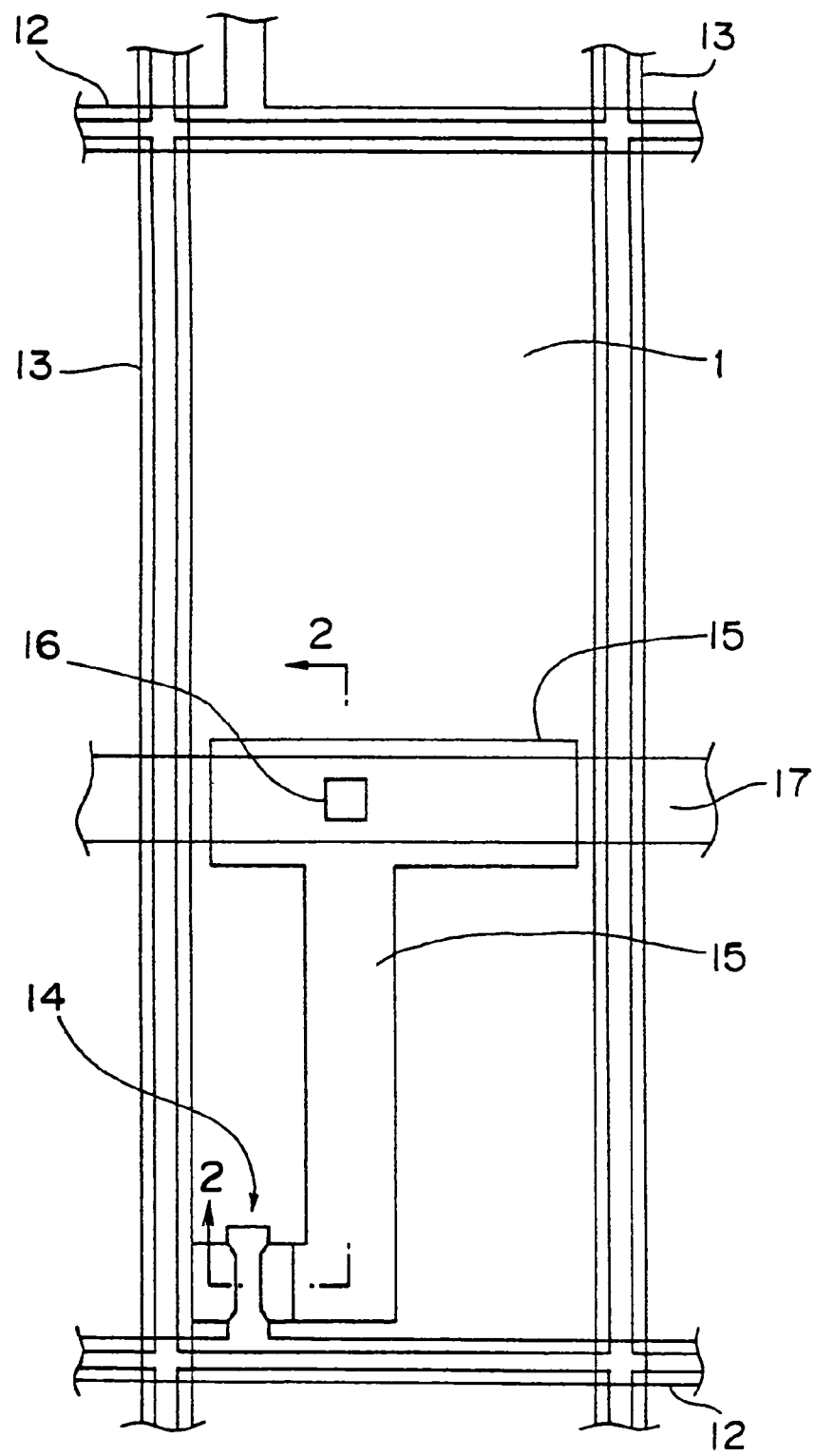
FIG. 1 is a plan view showing one pixel on an active matrix substrate according to an embodiment of the present invention.
Figure 2:
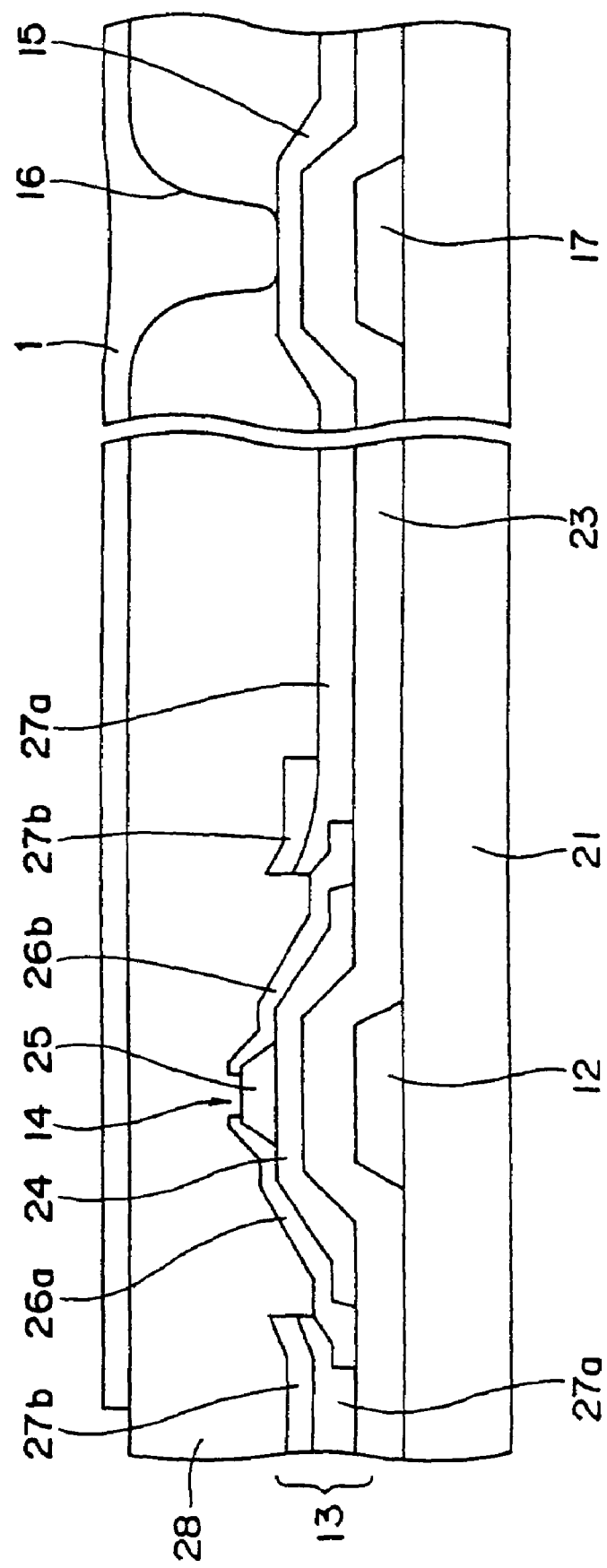
FIG. 2 is a cross sectional view taken on the line 2—2 of FIG. 1.
Figure 7:
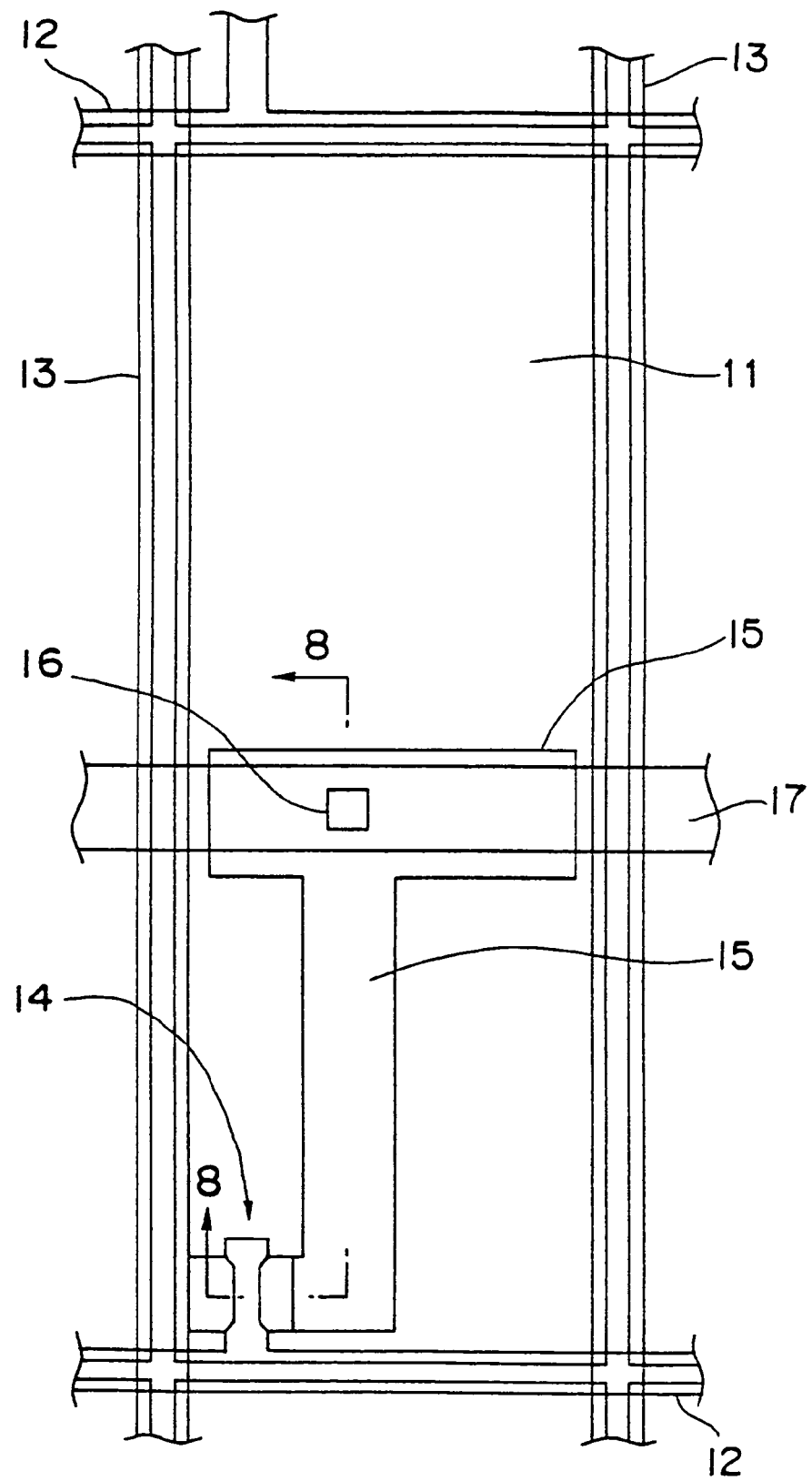
FIG. 7 is a plan view showing one pixel on a conventional active matrix substrate.
Figure 8:
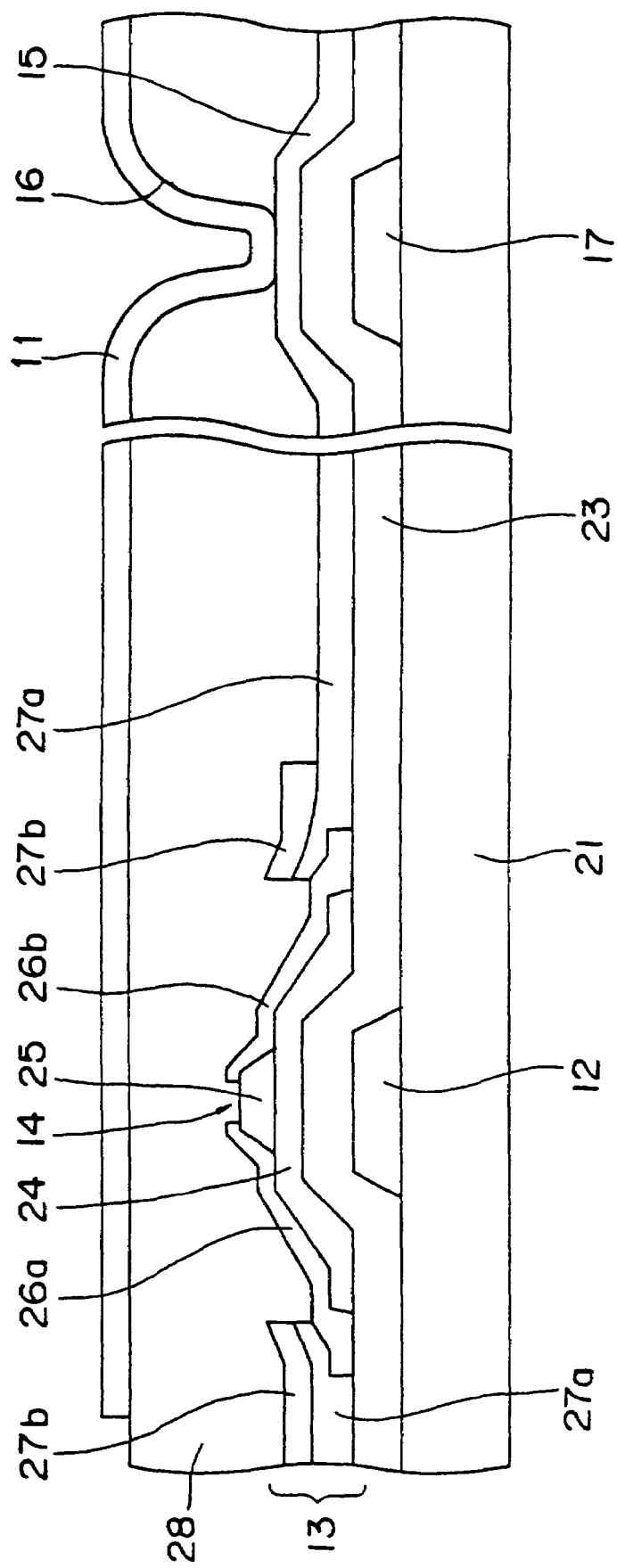
FIG. 8 is a cross sectional view taken on the line 8—8 of FIG. 7.

FIG. 1 is a plan view showing one pixel extracted from the pixels disposed in the shape of a matrix on an active matrix substrate as one example of the present invention, and FIG. 2 is a cross sectional view taken on the line 2—2 of FIG. 1. Except that the material and fabrication method of a pixel electrode is different, the active matrix substrate has the same configuration as the prior art shown in FIGS. 7 and 8, so that like component members are designated by like reference numerals.

The active matrix substrate is composed of: gate signal lines 12 placed on a light permeable substrate 21 along the lower side of a rectangle shown in the plan view and sending signals to a gate of a TFT 14; capacity lines 17 placed on the light permeable substrate 21 and positioned crosswise in the center of the rectangle of the plan view; a gate insulating film 23 covering the lines 12 and 17, and the light permeable substrate 21; TFTs 14 serving as switching elements placed on the gate insulating film 23 and positioned lower left corner of the rectangle shown in the plan view; source signal lines 13 placed on the gate insulating film 23 along the left side of the rectangle of the plan view for sending a data signal to a source of the TFT 14; an interlayer insulating film 28 for covering the above parts; and pixel electrodes 1 described later connected to the TFT 14 through a contact hole 16 piercing through the interlayer insulating film 28 and through a connection electrode 15.

The TFT 14 is made up of a semiconductor layer 24 made from amorphous Si (Silicon) formed on the gate signal line 12 through the gate insulating film 23, and a source electrode 26a and a drain electrode 26b made from $n^+$ type amorphous Si formed on the both sides of the semiconductor layer 24 with a channel protection layer 25 interposed therebetween. The source signal line 13 and part of the connection electrode 15 are formed by laminating a transparent conductive line 27a and a metal line 27b. The interlayer insulating film 28 is made from an inorganic insulator such as $SiO_2$ and SiNx or an organic insulator such as acrylic resin and polyimide resin.

The pixel electrode 1 characterizing the present invention is formed by applying on the interlayer insulating film 28 a photosensitive transparent resin such as negative acrylic polymerized resin containing 50 to 90 wt % particles (particle size of 0.001 to 0.05 μm) made from either indium tin oxide (ITO), antimony tin oxide (ATO), or zinc oxide (ZnO) as a photosensitive conductive material. Accordingly, unlike the prior art pixel electrode 11 shown in FIG. 8, a convex is not generated in the portion of the contact hole 16 piercing through the interlayer insulating film 28, so that the pixel electrode 1 has an approximately flat surface by filling the contact hole 16.

The above-configured active matrix substrate is fabricated by the following process.

First, a gate signal line 12 and a capacity line 17 are formed on a light permeable substrate 21, and a gate insulating film 23 is formed so as at least to cover the lines 12 and 17. After that, at the place for forming a TFT 14, there are formed a semiconductor layer 24, a channel protection layer 25 as needed, a source electrode 26a, and a drain electrode 26b. Then, there are formed a source signal line 13 to be connected to the source electrode 26a, and a connection electrode 15 to be connected to the drain electrode 26b, and thereafter an interlayer insulating film 28 is formed over the entire surface of the light permeable substrate 21. Further, in order to establish contact between a pixel electrode 1 formed on the interlayer insulating film 28 and the connection electrode 15, a contact hole 16 is provided in the interlayer insulating film 28. The fabrication process up to this point is identical to that of the prior art shown in FIGS. 7 and 8.

Next, as a transparent conductive film serving as a pixel electrode 1, a coat-type photosensitive transparent conductive material (e.g. a material made from transparent photosensitive resin and ultrafine particles of ITO or ATO dispersed in the transparent photosensitive resin, or a material made from transparent photosensitive resin and ultrafine particles of ZnO dispersed in the transparent photosensitive resin as disclosed in Japanese Patent Laid-Open Publication HEI 10-255556) is applied uniformly over the entire surface of the substrate by spin coating method, and dried at the temperature of 80° C. to 100° C. for 5 to 15 minutes.

Next, the dried photosensitive transparent conductive film is mask-exposed, and developed to obtain a desired shape by using TMAH (tetra methyl ammonium hydroxide) based organic alkaline developing solution. Then, the film is baked at the temperature of 200° C. to 250° C. for 15 to 30 minutes, by which pattern formation of a pixel electrode 1 is implemented and an active matrix substrate is completed.

In thus-fabricated active matrix substrate, the pixel electrode 1 is composed of a photosensitive conductive material, so that in the process of patterning the pixel electrode 1, the step of etching using photo resist is not necessary. Consequently, the pixel electrode 1 can be fabricated by a simple process consisting of applying a conductive material with photosensitivity on the substrate, and performing mask-exposure and development. Therefore, the fabrication process of the pixel electrode can be shortened.

In addition, vacuum film-creating devices such as sputtering systems as well as etching units for ITO are not necessary, which enables reduction of equipment investments, decrease of device space required, and increase of working efficiency.

Further in this active matrix substrate, the pixel electrode 1 is formed on the interlayer insulating film 28 which is formed on the gate signal line 12, source signal line 13, and the TFT 14, so that the pixel electrode 1 is to be formed in the final fabrication process of the active matrix substrate. Consequently, the material of the pixel electrode could not affect the film-formation process of other parts, which brings about broader selections of materials for the pixel electrode. For example, such materials as coat-type transparent conductive materials containing an organic component (resin component) as disclosed in the above-stated Japanese Patent Laid-Open Publication HEI 10-255556 can be broadly used.

Figure 9:
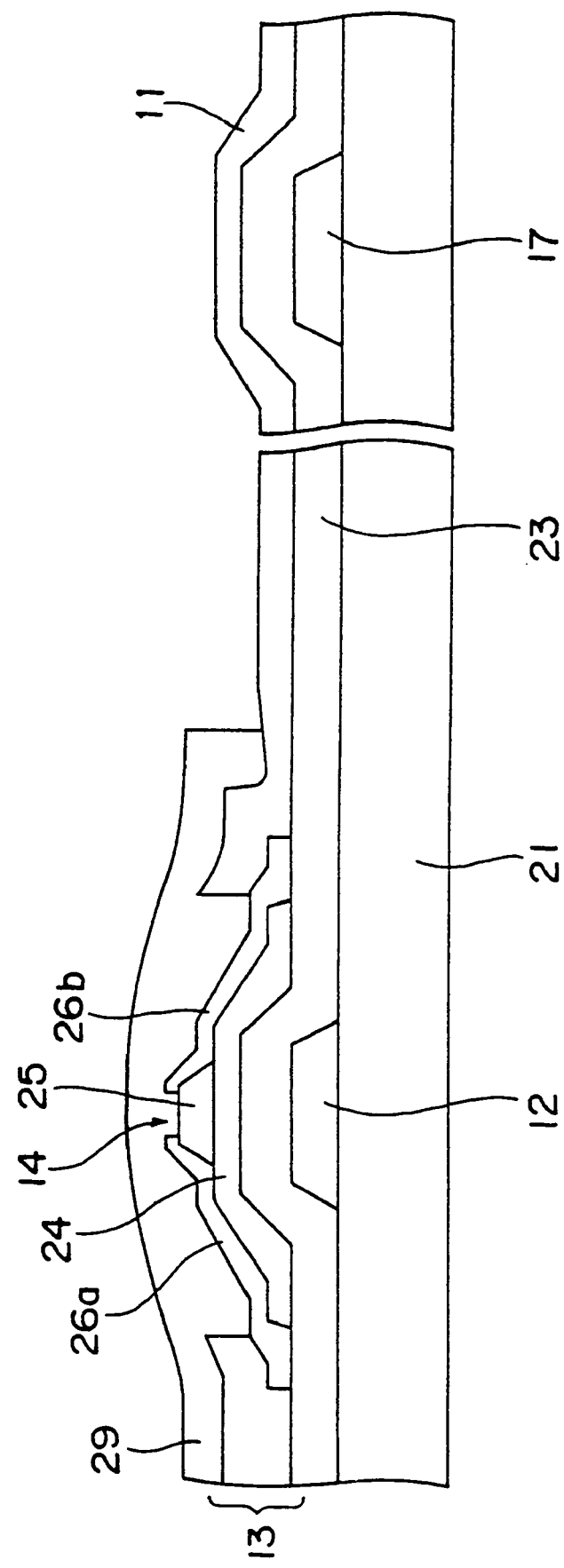
FIG. 9 is a cross sectional view showing a conventional active matrix substrate without an interlayer insulating film.

FIG. 9 is a cross sectional view of an conventional active matrix substrate without an interlayer insulating film 28. FIG. 9 is presented to clarify that the configuration shown in FIGS. 1 and 2 in which the interlayer insulating film 28 is provided underneath the pixel electrode 1 is essential for a coat-type transparent conductive material.

In the active matrix substrate of FIG. 9, after the pixel electrode 11 is formed, there is formed an insulating overcoat 29 made from SiNx or $SiO_2$ for preventing exposure of the TFT 14 and the source signal line 13. The insulating overcoat 29 is normally formed by plasma CVD method at the temperature of 300° C. or above. Consequently, if a coat-type transparent conductive material containing an organic component (resin component) according to the present invention is used as a material of the pixel electrode 11 which is laminated prior to the insulating overcoat 29, the coat-type transparent conductive material will degenerate in the formation process of the insulating overcoat 29.

Therefore, in order to use a coat-type transparent conductive material containing an organic component (resin component) according to the present invention as a pixel electrode, the active matrix substrate needs the configuration having an interlayer insulating film 28 underneath the pixel electrode 1 as shown in FIGS. 1 and 2.

It will be understood that the photosensitive transparent conductive material used as a pixel electrode of the present invention is not limited to a material made from transparent photosensitive resin and ultrafine particles of ITO, ATO or ZnO dispersed therein as described in the above-stated embodiment. However, using such material facilitates impartation of photosensitivity to ITO, ATO or ZnO, and brings about an advantage that the photosensitive resin determining patterning conditions such as pre-bake temperature and light exposure, and the transparent conductive particles determining conductivity can be separately optimized. In addition, use of ITO, ATO or ZnO as transparent conductive ultrafine particles has an advantage of facilitating implementation of the transparency (visible light transmissivity: 90% or above) and the electric characteristics (value of sheet resistance: 1E5 Ω/□ or lower) required for the pixel electrode.

It will be also understood that the photosensitive transparent conductive material is not limited to a coat-type one, but a laminate-type dry film material is also applicable.

Figure 3A:
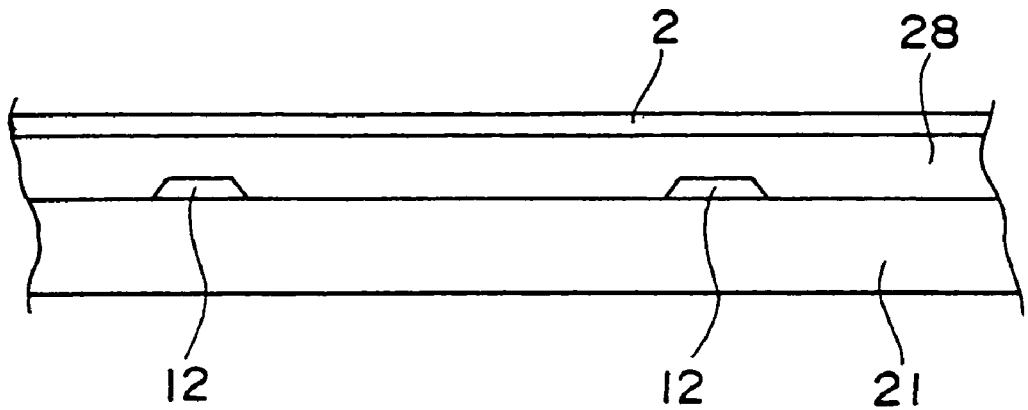
FIGS. 3A, 3B and 3C are schematic views showing fabrication process of the pixel electrode shown in FIGS. 1 and 2.
Figure 3B:
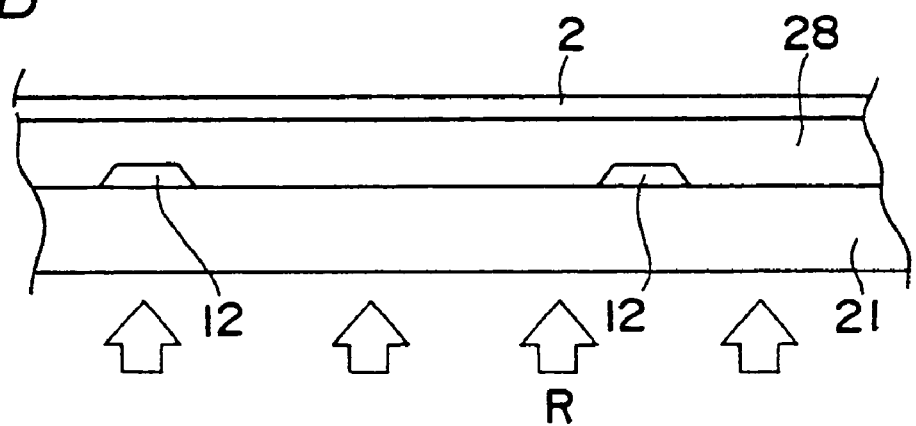
Figure 3C:
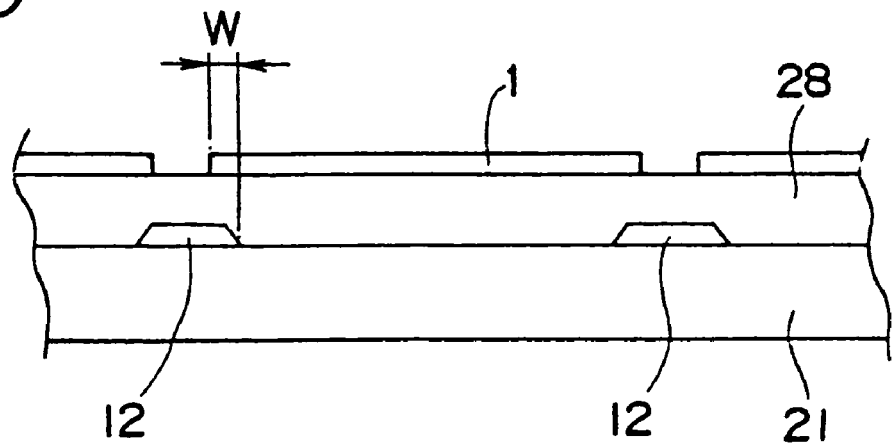

FIGS. 3A to 3C are schematic views showing the fabrication process of the pixel electrode 1 shown in FIGS. 1 and 2. The pixel electrode 1 is fabricated by the following process. It is noted that some layers are omitted in FIGS. 3A to 3C to simplify the drawings.

First, as shown in FIG. 3A, on the surface of an interlayer insulating film 28 formed on a light permeable substrate 21, there is applied a negative type photosensitive transparent conductive material 2, in which an exposed portion is left as a pattern.

Next, as shown in FIG. 3B, the back side of the light permeable substrate 21 is exposed to ultraviolet rays R. Here is an important point. A metallic gate signal line 12 and source signal line 13 (which is not shown in FIG. 3, though changing reference numeral 12 to 13 will indicate the state with the source signal line) formed on the light permeable substrate 21 function as exposure masks, so that the ultraviolet rays are not emitted to the portions where the signal lines 12 are placed. If there are the portions of the photosensitive transparent conductive material 2 to be exposed which is hindered from being exposed to the rays from the back side of the light permeable substrate 21 because the portions are located on top of the capacity line 17 or TFT 14, conventional exposure from the front side of the light permeable substrate 21 may be performed together with the back side exposure.

Development processing after exposure implements patterning of a pixel electrode 1 as shown in FIG. 3C. In the exposing step shown in FIG. 3B, the back side exposure is performed by using the signal lines 12, 13 as masks, so that unexposed parts of the photosensitive transparent conductive material just above the signal lines 12 and 13 are removed, by which the pattern of a pixel electrode 1 is formed with the removed parts above the signal lines 12 and 13 as boundaries.

The back side exposure with a negative type photosensitive transparent conductive material generates following advantages.

Performing exposure from the back side of the substrate 21 by using the gate signal line 12 and the source signal line 13 formed on the substrate 21 as exposure masks enables self-aligned pattern formation of a rectangle pixel electrode 1 without practicing alignment. As a result, dispersion of parasitic capacitance Cw, which is generated in a superposed portion W (see FIG. 3C) of the pixel electrode 1 and the gate signal line 12 or the source signal line 13, can be uniformed in the entire pixel area. Consequently, if the active matrix substrate of the present invention is applied to flat panel display devices, the potential fluctuation of the pixel electrode 1 through the parasitic capacitance Cw is uniformed in all the pixels, which improves uniformity of display. In addition, if the active matrix substrate is applied to flat panel image sensing devices, the potential fluctuation of the pixel electrode 1 with the parasitic capacitance Cw is uniformed in all the pixels, which improves uniformity of photographed images.

In addition, since exposure is performed from the back side of the substrate 21, the photosensitive transparent conductive material 2 applied over each signal line is not exposed unless any defect such as open holes are present on the signal lines. Accordingly, unlike the case of mask exposure of conventional positive type photo resist, there is not generated in an unexposed portion a conductive film remain attributed to the presence of dust between pixel electrodes in the process of exposure. Therefore, short-circuit between the pixel electrodes is not produced, which ensures insulation between the pixel electrodes.

Generally, in the case where an active matrix substrate is applied to liquid crystal display devices, orientation of liquid crystal molecules is disturbed in the vicinity of the edges of a pixel electrode 1. Accordingly, in order to cover up the disturbed orientation, it is preferable to superimpose the edges of the pixel electrode 1 on the gate signal line 12 or the source signal line 13. In that case, if the pixel electrode is formed by the back side exposure, setting exposure condition to an overexposure mode enables arbitral regulation of the width of the superimposed portion W of the pixel electrode 1 and the gate signal line 12 or the source signal line 13 within the range of 0 to 2 μm, which is a large advantage.

In order to solve the prior art problems i), ii), and iii), the above exemplified embodiment uses a negative type photosensitive conductive material as a pixel electrode. However, for solving the problem i) only, a positive type photosensitive conductive material may be used.

Further, in the case where the active matrix substrate is applied to display devices, the following configuration allows the pixel electrode of the active matrix substrate to serve as a color filter.

Figure 4:
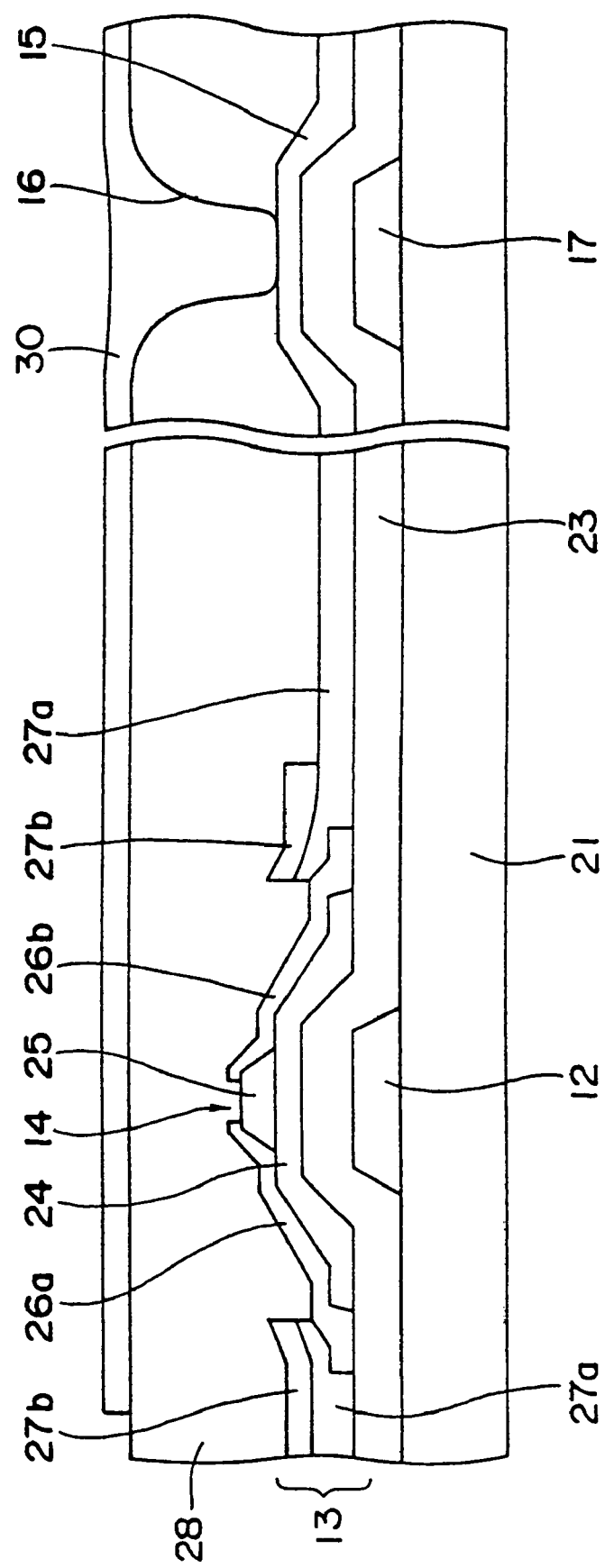
FIG. 4 is a cross sectional view showing an active matrix substrate according to another embodiment of the present invention.

FIG. 4 is a cross sectional view of an active matrix substrate according to another embodiment of the present invention. The basic configuration thereof is the same as that of the configuration shown in FIG. 2 except the point that a color pixel electrode 30 having a color filter function is substituted for the pixel electrode 1.

A coat-type photosensitive color conductive material is used as a color conducting layer which serves as a color pixel electrode 30. More specifically, there is used a material made from transparent photosensitive resin, conductive ultrafine particles such as ITO, ATO, and ZnO and color agents composed of inorganic or organic materials (e.g. pigments with the particle size of 10 nm or less) The transparent photosensitive resin, conductive ultrafine particles and color agents are blended at appropriate ratio (e.g. weight ratio of 1:1:1) and dispersed. The color pixel electrode 30 is applied evenly over the entire surface of the substrate by spin coating method as in the case of the above-stated pixel electrode 1. Then, the substrate is dried at the temperature of 80 to 100° C. for 5 to 15 minutes, and subjected to mask exposure and development processing. Thus, the pattern formation of the pixel electrode 30 is completed. It is noted that dyestuffs may be used instead of pigments as color agents.

As the pigments to be contained in the pixel electrode 30, there are prepared three kinds of pigments as a red (R) pigment, a green (G) pigment, and a blue (B) pigment. Corresponding to each pixel, the above-mentioned photo lithography process is repeated three times, by which a RGB color pixel electrode 30 is fabricated.

The color pixel electrode 30 has additional function as a color filter, so that in producing an active matrix substrate applicable to display devices capable of color display, a color filter formation process which has been required separately from the fabrication process of the pixel electrode is not required.

Further, in the case where an active matrix substrate and an opposite substrate are stuck together to fabricate display devices, the pixel electrode 30 having additional function as a color filter does not require formation of a color filter on the opposite substrate. Consequently, any displacement, if generated between the substrates in the course of sticking the substrates together, will not decrease the aperture ratio of the pixel.

Figure 5A:
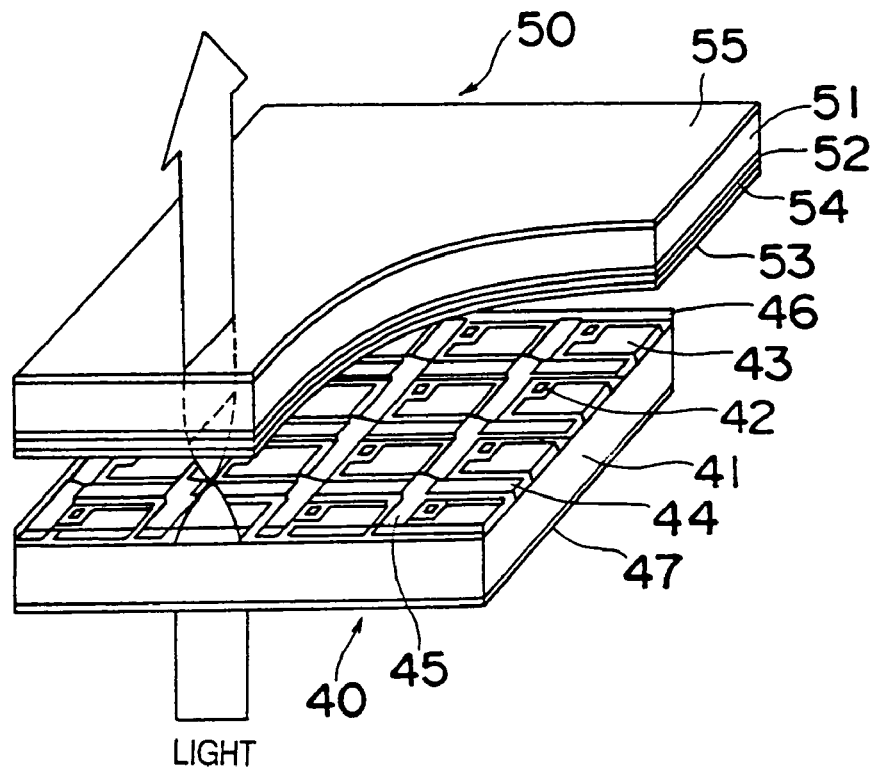
FIGS. 5A and 5B are respectively a perspective view and a circuit diagram schematically showing the configuration of a liquid crystal display device as an example of the flat panel display device according to the present invention.
Figure 5B:
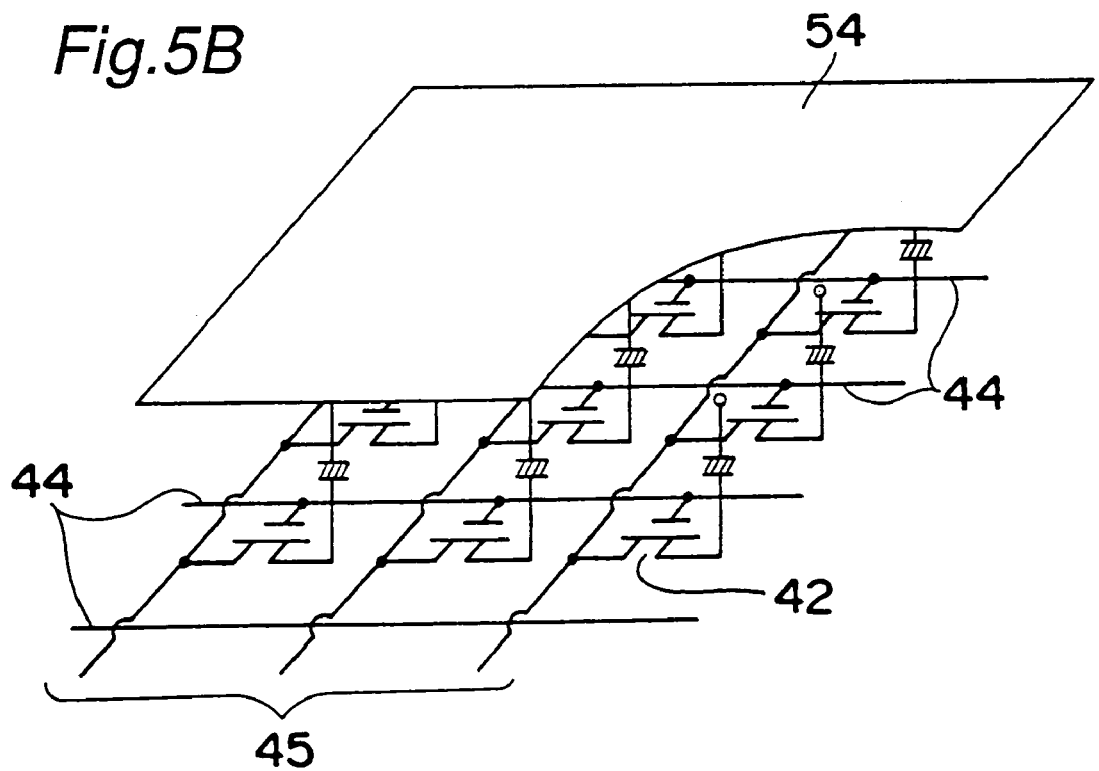

FIGS. 5A and 5B are, respectively, a perspective view and a circuit diagram showing schematic configuration of a liquid crystal display device as an example of the flat panel display device using an active matrix substrate of the present invention. The liquid crystal display device is configured to hold liquid crystals (not illustrated) as display mediums in between an active matrix substrate 40 and an opposite substrate 50. There are shown in FIG. 5 a glass substrate 41 of the active matrix substrate 40, a TFT 42 as a switching element, a pixel electrode 43 formed with the same material as that of the pixel electrode 1, a gate signal line 44, a source signal line 45, an oriented film 46, and a polarizer 47. Further, there are shown in the figure a glass substrate 51 of the opposite substrate 50, a color filter 52, an oriented film 53, an opposite electrode 54 made from ITO, and a polarizer 55. In this example, the material of the pixel electrode 43 does not contain coloring agents so that the color filter 52 is provided on the side of the opposite substrate 50. However, if a pixel electrode such as the pixel electrode 30 containing color agents is used, the pixel electrode functions as a color filter, so that the color filter 52 provided on the side of the opposite substrate 50 is not necessary.

It will be understood that the active matrix substrate of the present invention is applicable not only to liquid crystal display devices but also to various flat panel display devices using active matrix substrates (e.g. EL display devices, electrophoretic display devices and so on).

Figure 6:
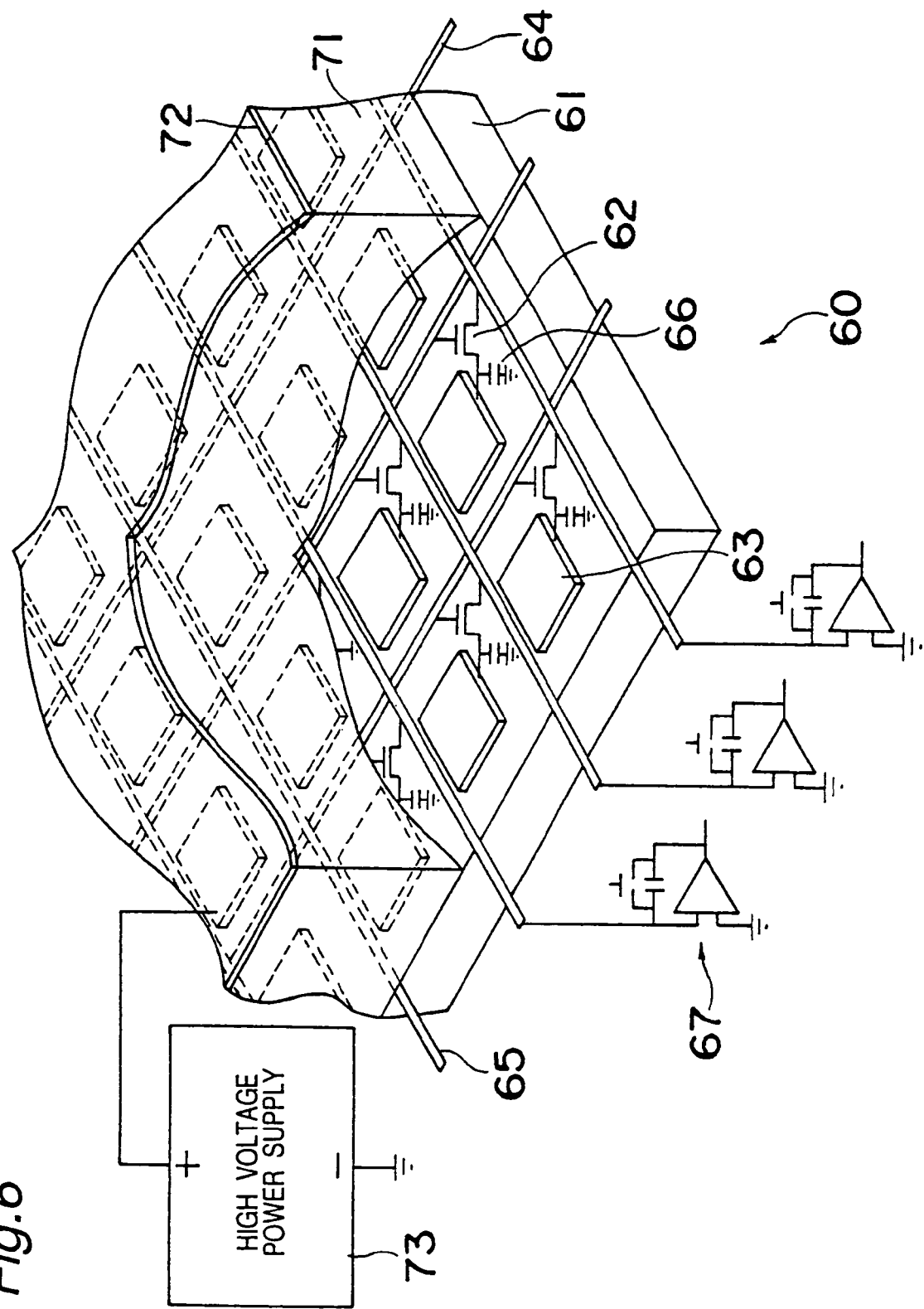
FIG. 6 is a perspective view schematically showing the configuration of one example of a flat panel image sensing device according to the present invention.

FIG. 6 shows the configuration of a X-ray (or light) image sensing device as one example of a flat panel image sensing device using the active matrix substrate of the present invention. On the active matrix substrate 60, there is formed a light dielectric film 71, which generates electric charge in response to X rays (or light). The information on X rays (or light) can be read by using the active matrix substrate 60. There are shown in FIG. 6 a glass substrate 61 on the side of the active matrix substrate 60, a TFT 62 as a switching element, a pixel electrode 63 formed with the same material as that of the pixel electrode 1, a gate signal line 64, a source signal line 65, a charge storage capacity 66, and an amplifier 67 connected to the source signal line 65. There are also shown an upper electrode 72 formed on the light dielectric film 71, and a high voltage power supply 73 connected to the upper electrode 72.

It is noted that in the case where an active matrix substrate is applied to nontransparent type display devices (e.g. self-luminous type and reflex type display devices) or image sensing devices, the pixel electrode of the active matrix substrate is not necessarily required to be transparent. Accordingly, although each of the above-stated embodiments is exemplified by the case of forming a pixel electrode by dispersing transparent conductive particles in photosensitive resin, the present invention is not limited to the embodiments disclosed. According to usage, a pixel electrode may be formed by dispersing nontransparent conductive particles (e.g. metal microparticles and carbon pigments) in photosensitive resin, or formed with photosensitive conducting materials made by providing conductive resin such as polyacetylene with photosensitivity.

As is clear from the above description, the active matrix substrate of the present invention has pixel electrodes made from a photosensitive conductive material, so that the pixel electrodes can be patterned by the simple step of applying a photosensitive conductive material over the substrate and performing mask exposure and development without the step of etching with photoresist. Therefore, fabrication process of the pixel electrode can be shortened, and vacuum film-forming devices such as sputters as well as etching units for ITO are not required, which enables reduction of equipment investments, decrease of device space required, and increase of working efficiency. Further in this active matrix substrate, the pixel electrode is formed on the interlayer insulating film, which is formed on the switching element, the gate signal line, and the source signal line, so that the pixel electrode is to be formed in the final fabrication process of the active matrix substrate. Consequently, the material of the pixel electrode does not affect the film-formation process of other parts, which brings about broader selections of materials for the pixel electrode including a coat-type material containing an organic component (resin component).

The active matrix substrate in one embodiment can be appropriately used as an active matrix substrate for transparent type display devices since the photosensitive conductive material is transparent.

According to the active matrix substrate of one embodiment, the photosensitive conductive material has negative type photosensitivity. Therefore, using the gate signal line and the source signal line formed on the substrate as exposure masks and performing exposure from the back side of the substrate enable self-aligned pattern formation of film placed for the pixel electrode and the like on the front side without practicing alignment. As a result, dispersion of parasitic capacitance, which is generated in a superposed portion of the pixel electrode and the gate signal line or in a superposed portion of the pixel electrode and the source signal line, can be uniformed in the entire pixel area, by which the uniformity of display is improved. In addition, a photosensitive conductive material applied over each signal line is not exposed unless any defect such as open holes are present on the signal lines. Accordingly, unlike the case of mask exposure of conventional positive type photo resist, a conductive film remain is not generated in clearance between pixel electrodes by the presence of dust in the process of exposure. Therefore, short-circuit between the pixel electrodes is not produced, which ensures insulation between the pixel electrodes.

According to one embodiment, the photosensitive conductive material is made from photosensitive resin and conductive particles dispersed in the photosensitive resin. In this case, the photosensitive conductive material can be formed easily. It is also advantageous that the photosensitive resin determining patterning conditions such as pre-bake temperature and light exposure and the conductive particles determining conductivity can be separately optimized.

In one embodiment, conductive particles are made from indium tin oxide, antimony tin oxide, or zinc oxide. Therefore, there is provided transparency and electric characteristics required for the pixel electrode.

In the active matrix substrate according to one embodiment, the photosensitive conductive material contains coloring agents, which imparts the function of a color filter for color display to the pixel electrode. This eliminates a necessity of separately fabricating a color filter. Furthermore, the pixel electrode functioning as a color filter eliminates the problem of displacement between the pixel electrode and a color filter, which could be generated when the color filter is separately fabricated, especially on an opposite substrate. As a result, the problem of decrease in aperture ratio of the pixel attributed to the displacement between the pixel electrode and the color filter is avoidable.

According to one embodiment, there is provided a flat panel display and an image sensing device having the above functions and effects because they use the active matrix substrate.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of making an active matrix substrate, the method comprising:
    forming switching elements disposed in a shape of a matrix, gate signal lines controlling the switching elements and extending in a first direction, and source signal lines connected to the switching elements and extending in a second direction perpendicular to the first direction on a front surface of a light permeable substrate;
    forming an interlayer insulating film on the switching elements, the gate signal lines, and the source signal lines;
    forming on the interlayer insulating film a negative type photosensitive transparent conductive material for a pixel electrode whose exposed parts are left in a pattern;
    performing exposure from a back surface side of the light permeable substrate in order to expose the negative type photosensitive transparent conductive material in a self-alignment fashion by using the gate signal lines and the source signal lines as exposure masks;
    developing the negative type photosensitive transparent conductive material so as to obtain pixel electrodes of the negative type photosensitive transparent conductive material by removing unexposed parts of the negative type photosensitive transparent conductive material.

2. The method of claim 1, wherein the negative type photosensitive conductive material comprises photosensitive resin and conductive particles dispersed in the photosensitive resin.

3. The method of claim 2, wherein the conductive particles comprise indium tin oxide or antimony tin oxide.

4. A method of making a flat panel display comprising the method of claim 1 for making the active matrix substrate of the flat panel display.

5. A method of making a flat panel image sensing device comprising the method of claim 1 for making the active matrix substrate thereof.

* * * * *